(12) United States Patent
Zhu et al.

(10) Patent No.: US 7,768,006 B2
(45) Date of Patent: Aug. 3, 2010

(54) FIELD EFFECT STRUCTURE AND METHOD INCLUDING SPACER SHAPED METAL GATE WITH ASYMMETRIC SOURCE AND DRAIN REGIONS

(75) Inventors: Huilong Zhu, Poughkeepsie, NY (US); Zhengwen Li, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 12/129,033

(22) Filed: May 29, 2008

(65) Prior Publication Data

US 2009/0294873 A1    Dec. 3, 2009

(51) Int. Cl.
*H01L 31/00* (2006.01)

(52) U.S. Cl. ............... 257/57; 257/66; 257/368; 257/E29.279; 438/149; 438/151; 438/166

(58) Field of Classification Search ............. 257/57–61, 257/66–72, 368–401, E29.279; 438/149, 438/151, 157, 166
See application file for complete search history.

(56) References Cited

U.S. PATENT DOCUMENTS

| 5,043,294 | A | * | 8/1991 | Willer et al. ............... 438/179 |
| 6,300,203 | B1 | * | 10/2001 | Buynoski et al. ............ 438/287 |
| 6,890,807 | B2 | | 5/2005 | Chau et al. |
| 7,153,734 | B2 | | 12/2006 | Brask et al. |
| 7,208,361 | B2 | | 4/2007 | Shah et al. |
| 2009/0218625 | A1 | * | 9/2009 | Adetutu et al. ............... 257/351 |

OTHER PUBLICATIONS

Scansen, in "Under the Hood: Intel's 45-nm high-k metal-gate process," EE Times Nov. 14, 2007.

* cited by examiner

*Primary Examiner*—Evan Pert
*Assistant Examiner*—Scott R Wilson
(74) *Attorney, Agent, or Firm*—Scully, Scott, Murphy & Presser, P.C.; H. Daniel Schnurmann (57) ABSTRACT

A semiconductor structure and a method for fabricating the semiconductor structure provide a field effect device, such as a field effect transistor, that includes a spacer shaped metal gate located over a channel within a semiconductor substrate that separates a plurality of source and drain regions within the semiconductor substrate. Within the semiconductor structure, the plurality of source and drain regions is asymmetric with respect to the spacer shaped metal gate. The particular semiconductor structure may be fabricated using a self aligned dummy gate method that uses a portion of a spacer as a self alignment feature when forming the spacer shaped metal gate, which may have a sub-lithographic linewidth.

20 Claims, 4 Drawing Sheets

FIELD EFFECT STRUCTURE AND METHOD INCLUDING SPACER SHAPED METAL GATE WITH ASYMMETRIC SOURCE AND DRAIN REGIONS

BACKGROUND

1. Field of the Invention

The invention relates generally to field effect structures, and methods for fabrication thereof. More particularly, the invention relates to field effect structures that provide field effect devices with enhanced performance, and methods for fabrication thereof.

2. Description of the Related Art

Semiconductor structures include semiconductor devices that are connected and interconnected with patterned conductor layers that are separated by dielectric layers. While semiconductor structures may include any of several semiconductor devices, such as but not limited to resistors, transistors, diodes and capacitors, a particularly common semiconductor device is a field effect device, such as a field effect transistor. In turn field effect transistors have been successfully scaled in dimension for several decades to provide a technology basis for continuing enhancements in semiconductor circuit performance and semiconductor circuit functionality.

While field effect transistors are thus an integral part of semiconductor technology, field effect transistors are nonetheless not entirely without problems as semiconductor technology advances. In particular, as semiconductor technology advances and semiconductor structure dimensions scale to physically limited dimensions, the use of alternative materials when fabricating semiconductor structures, such as field effect structures, has become more prevalent and prominent. Included among these particular alternative materials approaches for field effect transistor fabrication is the use of metal gate materials in place of polysilicon gate materials, for fabricating field effect transistor structure gate electrodes. Typically, such metal gate materials are selected and engineered to provide desirable gate work functions for particular field effect transistor gate electrodes.

Various semiconductor structures that include metal gates, and methods for fabricating those semiconductor structures, are known in the semiconductor fabrication art.

For example, Chau, et al., in U.S. Pat. No. 6,890,807, teaches a method for fabricating a field effect structure that includes a metal gate that has a variable and adjustable work function. To realize such a variable and adjustable work function, the metal gate includes a variable and adjustable amount of a particular impurity.

In addition, Brask et al., in U.S. Pat. No. 7,153,734, teaches a CMOS structure that includes a metal nMOS gate and a silicide pMOS gate. Within this particular CMOS structure, the metal nMOS gate and the silicide pMOS gate are fabricated using separate replacement gate processes.

Further, Shah et al., in U.S. Pat. No. 7,208,361, teaches a particular replacement gate method that may be used for fabricating a field effect structure, such as a field effect transistor structure, within a CMOS structure. This particular replacement gate method utilizes a dummy gate that is wider at a top interface thereof than at a bottom interface thereof.

Finally, Scansen, in "Under the Hood: Intel's 45-nm high-k metal-gate process," EE Times Nov. 14, 2007, http://www.eetimes.com/showArticle.jhtml?articleID=202806020, teaches field effect transistor structures that include a high-k gate dielectric material as well as a metal gate material. The particular field effect transistor structures, while introduced at a 45 nanometer node, are scalable to a 32 nanometer node.

The physical limitations and challenges of semiconductor device and semiconductor structure dimensional scaling are certain to continue as semiconductor technology advances. To that end, desirable are alternative approaches, such as but not limited to metal gate material approaches, that may be used for fabricating semiconductor devices and semiconductor structures with enhanced performance, as semiconductor device and semiconductor structure dimensions decrease.

SUMMARY

The invention provides a semiconductor structure and a method for fabricating the semiconductor structure. The semiconductor structure includes a field effect structure, such as but not limited to a field effect transistor structure, that includes a metal gate located over a channel within a semiconductor substrate that separates a plurality of source and drain regions within the semiconductor substrate. The particular semiconductor structure in accordance with the invention includes a metal gate that has a spacer shape, as well as a plurality of source and drain regions that are asymmetric with respect to the metal gate that has the spacer shape. Such asymmetry is intended to include, but is not necessarily limited to, an asymmetry in at least one of location, shape and dopant concentration profile of the plurality of source and drain regions with respect to the metal gate that has the spacer shape.

Figure 2:
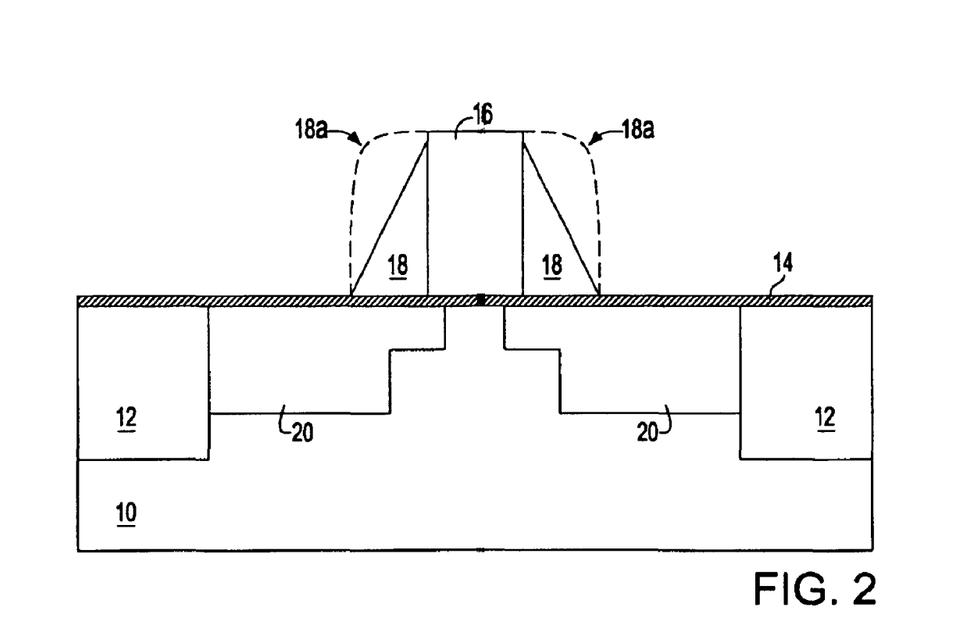
FIG. 2 to FIG. 7 show, in sequential order: (1) spacer formation; (2) partial spacer etch; (3) dummy gate etch; (4) metal gate material layer formation; (6) metal gate etch; and (6) transistor structure completion, within the semiconductor structure.

By "spacer shaped" with respect to the foregoing metal gate, it is intended that the metal gate has, in cross-section, three sides. Two of the three sides are nominally perpendicular, and the third of the three sides slopes, generally outwardly, from the termini of the other two sides. A particular schematic cross-sectional diagrammatic representation of such a cross-sectional spacer shape is illustrated in FIG. 2 with respect to a dielectric spacer 18/18a and FIG. 6 with respect to a metal gate 23'. Such a cross-sectional spacer shape generally results from a blanket spacer layer material or metal gate deposition upon a topographic feature and an anisotropic etchback to provide the spacer shaped dielectric spacer or metal gate adjoining a vertical sidewall of the topographic feature.

A particular method for fabricating the particular semiconductor structure in accordance with the invention utilizes a dummy gate in conjunction with a topographic feature dielectric spacer, where a portion of the topographic feature dielectric spacer serves as a self alignment feature for forming the spacer shaped metal gate to which the plurality of source and drain regions is asymmetric.

A particular semiconductor structure in accordance with the invention includes a semiconductor substrate that includes a channel region. This particular semiconductor structure also includes a plurality of source regions and drain regions located within the semiconductor substrate and separated by the channel region. This particular semiconductor structure also includes a metal gate that has a spacer shape located over the channel region. The plurality of source regions and drain regions is asymmetric with respect to the metal gate.

Another particular semiconductor structure in accordance with the invention includes a semiconductor substrate that includes a channel region. This other particular semiconductor structure also includes a plurality of source regions and drain regions located within the semiconductor substrate and separated by the channel region. This other particular semiconductor structure also includes a metal gate that has a spacer shape located over the channel region. This other particular semiconductor structure also includes a spacer located adjacent opposite sidewalls of the metal gate. The plurality of source regions and drain regions is asymmetric with respect to the metal gate.

A particular method for fabricating a semiconductor structure in accordance with the invention includes forming a dummy gate over a semiconductor substrate. This particular method also includes forming a spacer adjacent the dummy gate. This particular method also includes forming a plurality of source regions and drain regions into the semiconductor substrate that are separated by a channel within the semiconductor substrate while using, at least in part, the dummy gate and the spacer as a mask. This particular method also includes stripping a portion of the spacer, and all of the dummy gate, from over the semiconductor substrate to leave a remaining portion of the spacer over the semiconductor substrate. This particular method also includes forming a spacer shaped metal gate over the channel and asymmetric with respect to the plurality of source regions and drain regions while using the remaining portion of the spacer as a self-alignment feature.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, that form a material part of this disclosure, wherein:

FIG. 1 to FIG. 7 shows a series of schematic cross-sectional diagrams illustrating the results of progressive stages of fabricating a semiconductor structure in accordance with a particular embodiment of the invention.

DESCRIPTION OF THE PREFERRED EMBODIMENTS

The invention, which includes a semiconductor structure and a method for fabricating the semiconductor structure, is understood within the context of the description set forth below. The description set forth below is understood within the context of the drawings described above. Since the drawings are intended for illustrative purposes, the drawings are not necessarily drawn to scale.

Figure 1:
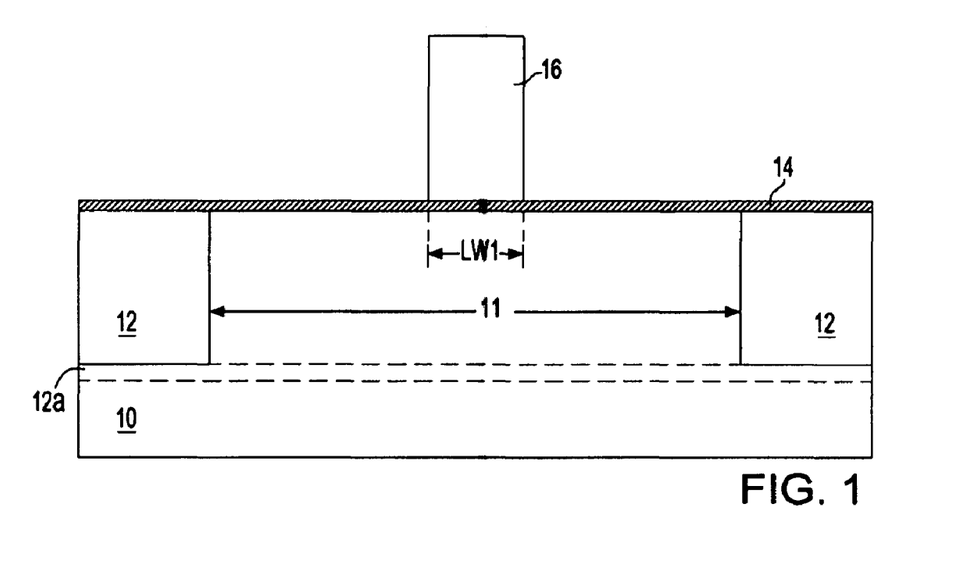
FIG. 1 shows a schematic cross-sectional diagram of the semiconductor structure at an early stage in the fabrication thereof.

FIG. 1 to FIG. 7 show a series of schematic cross-sectional diagrams illustrating the results of progressive stages in fabricating a semiconductor structure in accordance with a particular embodiment of the invention. This particular embodiment of the invention comprises a first embodiment of the invention. FIG. 1 shows a schematic cross-sectional diagram of the semiconductor structure at an early stage in the fabrication thereof in accordance with this particular first embodiment.

FIG. 1 shows a semiconductor substrate 10. An isolation region 12 is located and formed embedded within the semiconductor substrate 10 to define and bound an active region 11 of the semiconductor substrate 10. A gate dielectric 14 is located and formed upon exposed portions of the semiconductor substrate 10 (i.e., the active region 11) and the isolation region 12. Finally, a dummy gate 16 is located and formed upon the gate dielectric 14 and nominally centered above the active region 11 of the semiconductor substrate 10. Each of the foregoing semiconductor substrate 10, and layers and structures 11, 12, 14 and 16 may comprise materials, have dimensions and be formed using methods that are otherwise generally conventional in the semiconductor fabrication art.

For example, the semiconductor substrate 10 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the semiconductor substrate 10 comprises a silicon or silicon-germanium alloy semiconductor material that has a thickness from about 1 to about 3 millimeters.

The isolation region 12 may comprise any of several dielectric isolation materials. Non-limiting examples of such dielectric isolation materials include oxides, nitrides and oxynitrides, in particular of silicon. However, oxides, nitrides and oxynitrides of other elements are not excluded. The isolation region 12 may comprise a crystalline or a non-crystalline dielectric material, with crystalline dielectric materials generally being highly preferred. The isolation region 12 may be formed using any of several methods. Non-limiting examples include ion implantation methods, thermal or plasma oxidation or nitridation methods, chemical vapor deposition methods and physical vapor deposition methods. Typically, the isolation region 12 comprises at least in-part an oxide of the semiconductor material from which is comprised the semiconductor substrate 10. Typically, the isolation region 12 penetrates to a depth within the semiconductor substrate 10 from about 150 to about 500 nanometers. Alternatively, and as discussed below, when using a semiconductor-on-insulator (SOI) substrate, an isolation region may have a depth from about 10 to about 150 nanometers within the semiconductor-on-insulator substrate.

The gate dielectric 14 may comprise conventional dielectric materials such as oxides, nitrides and oxynitrides of silicon that have a dielectric constant from about 4 to about 20, measured in vacuum. Alternatively, and preferably, the gate dielectric 14 may comprise generally higher dielectric constant dielectric materials having a dielectric constant from about 20 (or alternatively greater than 20) to at least about 100. Such higher dielectric constant dielectric materials may include, but are not limited to hafnium oxides, hafnium silicates, titanium oxides, barium-strontium-titantates (BSTs) lead-zirconate-titanates (PZTs), $ZrO_2$, $Al_2O_3$, $TiO_2$, $La_2O_3$, $SrTiO_3$, and $LaAlO_3$. The gate dielectric 14 may be formed using any of several methods that are appropriate to the material of composition of the gate dielectric 14. Included, but not limiting are thermal or plasma oxidation or nitridation methods, chemical vapor deposition methods (including atomic layer deposition methods) and physical vapor deposition methods (including sputtering methods). Typically, the gate dielectric 14 comprises a laminate of a generally lower dielectric constant dielectric material (i.e., such as but not limited to a silicon oxide dielectric material that has a thickness from about 0.8 to about 3 nanometers), upon which is formed a higher dielectric constant dielectric material (i.e., such as but not limited to a hafnium oxide dielectric material or a hafnium silicate dielectric material that has a thickness from about 1 to about 5 nanometers).

The dummy gate 16 comprises a sacrificial material that is selected within the context of a desirable etch selectivity of the sacrificial material with respect to: (1) surrounding materials from which are comprised layers and structures within the semiconductor structure whose schematic cross-sectional diagram is illustrated in FIG. 1; as well as (2) additional materials for additional layers and structures that are illustrated within subsequent schematic cross-sectional diagrams. Thus, in general, the dummy gate 16 may comprise materials including but not limited to conductor materials, semiconductor materials and dielectric materials. However, from a practical perspective, and under circumstances where the gate dielectric 14 comprises at least in part an upper layer which comprises a hafnium based dielectric material having a generally higher dielectric constant, the dummy gate 16 may plausibly comprise a generally conventional dielectric material selected from the group including but not limited to silicon oxide dielectric materials, silicon nitride dielectric materials and silicon oxide dielectric materials having the above described etch selectivity. Alternatively, the dummy gate 16 may also preferably comprise a polysilicon material. Typically, the dummy gate 16 comprises a polysilicon material that has a linewidth LW1 from about 10 to about 100 nanometers.

Although FIG. 1 illustrates the instant particular embodiment within the context of a semiconductor substrate 10 that implicitly comprises a bulk semiconductor substrate, neither the instant particular embodiment, nor the invention more generally, is intended to be so limited. Rather, this particular embodiment and alternative embodiments also contemplate the use of a semiconductor-on-insulator substrate and/or a hybrid orientation substrate in place of a bulk semiconductor substrate, for the semiconductor substrate 10.

A semiconductor-on-insulator substrate results from incorporation of a buried dielectric layer 12a (i.e., as illustrated in phantom in FIG. 1) incorporated interposed between a base semiconductor substrate portion of the semiconductor substrate 10 and a surface semiconductor layer portion of the semiconductor substrate 10 that is illustrated in FIG. 1. The base semiconductor substrate portion of the semiconductor substrate 10 and the surface semiconductor layer portion of the semiconductor substrate 10 may comprise the same or different semiconductor components with respect to chemical composition, crystallographic orientation, dopant polarity and dopant concentration. The buried dielectric layer 12a will typically comprise a dielectric material, and be formed using a particular method, that are otherwise analogous, equivalent or identical to the methods and materials that are used for fabricating the isolation region 12. Typically, the buried dielectric layer 12a has a thickness from about 20 to about 200 nanometers, and as illustrated in FIG. 1, the isolation region 12 contacts the buried dielectric layer 12a.

A hybrid orientation substrate includes multiple semiconductor material regions of different crystallographic orientation. Semiconductor-on-insulator substrates and hybrid orientation substrates may be formed using methods including but not limited to layer transfer methods, layer lamination methods and separation by implantation of oxygen (SIMOX) methods.

Although also not particularly illustrated in FIG. 1, the instant embodiment and additional alternative embodiments also contemplate mechanical stress inducing structures that induce a particularly desirable mechanical stress within a channel region sub-portion of the active region 11. Such a mechanical stress may be compressive or tensile, and of a pertinent magnitude that is appropriate for a particular polarity (i.e., conductivity type) of a field effect device desired to be located and formed within the active region 11.

FIG. 2 shows a spacer 18 located adjacent and adjoining the sidewalls of the dummy gate 16. Although illustrated as a plurality of layers in the schematic cross-sectional diagram of FIG. 2, the spacer 18 is actually intended as a single layer encircling the dummy gate 16 in plan view. Similarly, although also illustrated within the context of a triangular cross-sectional shape, with nominally straight surfaces, the spacer 18 is typically better illustrated in cross-section within the context of the phantom lines 18a, that are intended to provide the spacer 18 having three sides, two of which are nominally perpendicular and the remaining side connecting in a convex curved fashion to the termini of the two nominally perpendicular sides.

The spacer 18 may comprise materials including, but not limited to conductor materials and dielectric materials. Conductor spacer materials are less common, but are nonetheless known. Dielectric spacer materials are more common. Dielectric spacer materials in particular may be formed using methods analogous, equivalent or identical to the methods that are used for forming the isolation region 12. The spacer 18 is also formed with the distinctive inward pointing spacer shape (i.e., with respect to the dummy gate 16) by using a blanket layer deposition and anisotropic etchback method. Typically, the spacer 18 comprises a silicon nitride material, although the embodiment is not so limited.

FIG. 2 also shows a plurality of source and drain regions 20 located and formed into the active region 11 of the semiconductor substrate 10 and separated by the channel region located beneath the dummy gate 16. The plurality of source and drain regions 20 comprises a generally conventional dopant of a polarity consistent with a polarity of a field effect device desired to be formed within the active region 11. As is understood by a person skilled in the art, the plurality of source and drain regions 20 is formed using a two-step ion implantation method. A first ion implantation process step within the method uses the dummy gate 16, absent the spacer 18, as a mask to form a plurality of extension regions, each of which extends beneath the spacer 18. A second ion implantation process step uses the dummy gate 16 and the spacer 18 as a mask to form the larger contact region portions of the plurality of source and drain regions 20 while simultaneously incorporating the plurality of extension regions. Dopant concentrations are typically from about 1e19 to about 1e21 dopant atoms per cubic centimeter within each of the plurality of source and drain regions 20. Extension regions within the plurality of source and drain regions 20 may under certain circumstances be more lightly doped than contact regions with the plurality of source and drain regions 20, although such differential doping concentrations are not a requirement of the instant particular embodiment.

Figure 3:
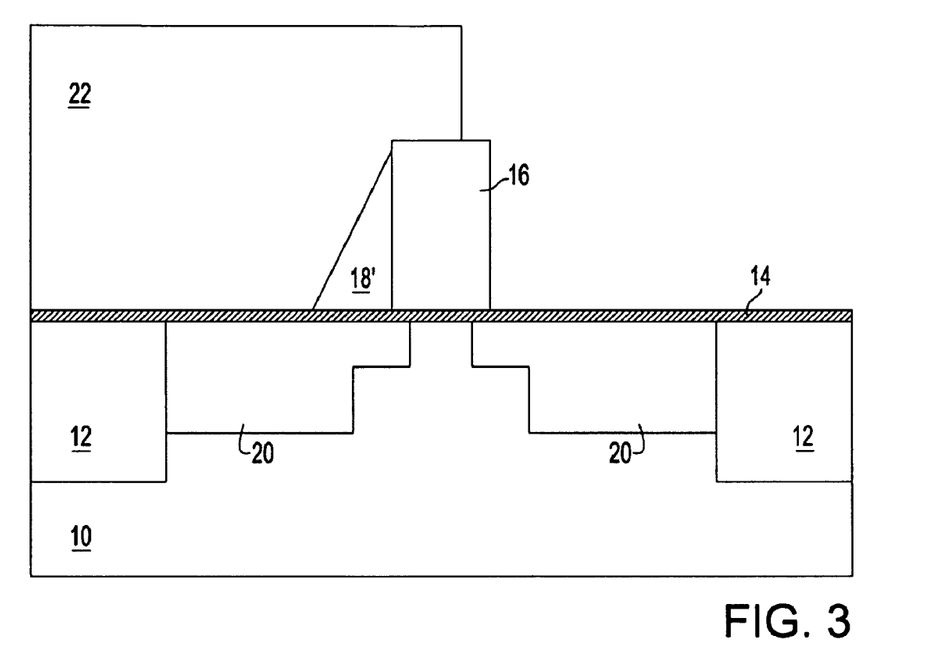

FIG. 3 shows a block mask 22 located and formed to cover approximately one-half of the spacer 18 and one-half of the dummy gate 16 that is illustrated in FIG. 2. The block mask 22 may comprise any of several mask materials, including but not limited to hard mask materials and resist mask materials, although resist materials, such as but not limited to photoresist materials, are most common. Within the context of resist materials, the block mask 22 may comprise resist materials including but not limited to positive resist materials, negative resist materials and hybrid resist materials that possess properties of positive resist materials and negative resist materials. Typically, the block mask 22 comprises a positive resist material or a negative resist material that has a thickness from about 200 to about 500 nanometers.

FIG. 3 also shows the results of etching the spacer 18 that is illustrated in FIG. 2 to provide a spacer 18' while using the block mask 22 as an etch mask. The spacer 18 that is illustrated in FIG. 2 may be etched to form the spacer 18' that is illustrated in FIG. 3 while using the block mask 22 as an etch mask while using etch methods and etch materials that are appropriate to the material or materials from which is comprised the spacer 18. Non-limiting examples of methods and materials include wet chemical etch methods and materials, dry plasma etch methods and materials and combinations of wet chemical etch methods and materials and dry plasma etch methods and materials.

Figure 4:
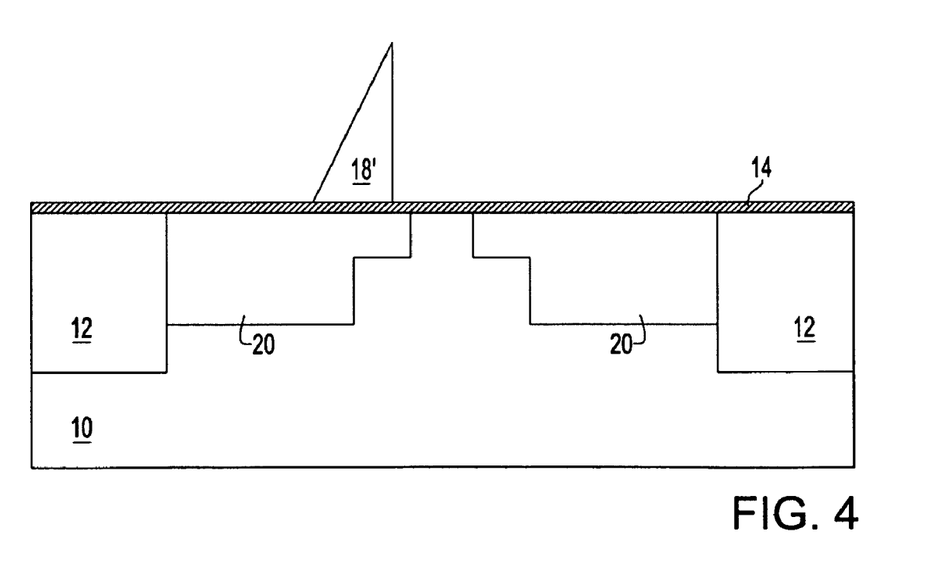

FIG. 4 first shows the results of stripping the block mask 22 from the semiconductor structure of FIG. 3. The block mask 22 may be stripped using methods and materials that are otherwise generally conventional in the semiconductor fabrication art. Non-limiting examples include wet chemical stripping methods and materials, dry plasma stripping methods and materials and combinations of wet chemical stripping methods and materials and dry plasma stripping methods and materials.

FIG. 4 also shows the results of stripping the dummy gate 16 from the semiconductor structure of FIG. 3 after having stripped the block mask 22 from the semiconductor structure of FIG. 3. The dummy gate 16 may also be stripped using methods and materials that are otherwise generally conventional in the semiconductor fabrication art. Also included in particular, but also not limiting, are wet chemical stripping methods and materials, dry plasma stripping methods and materials and combinations of wet chemical stripping methods and materials and dry plasma stripping methods and materials.

Figure 5:
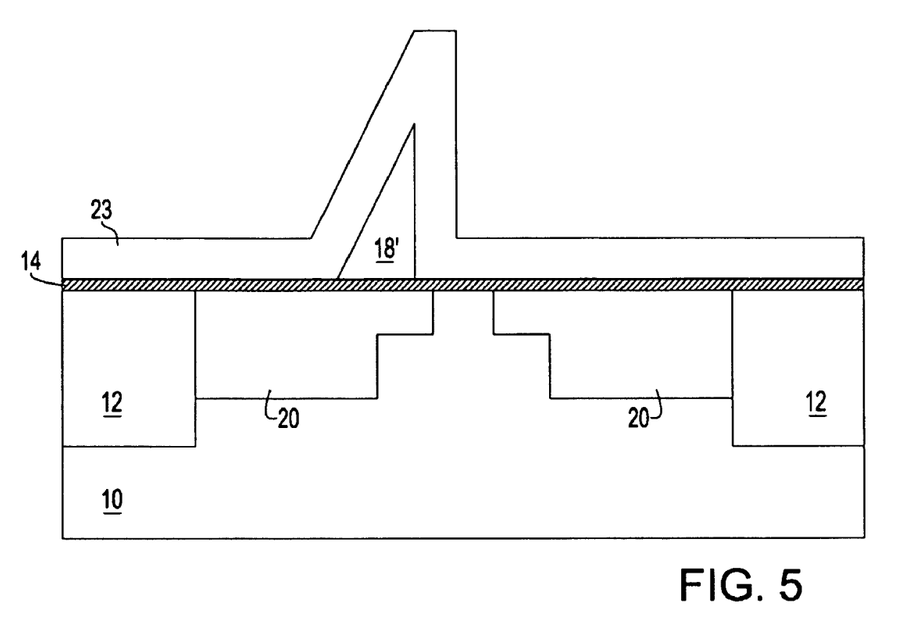

FIG. 5 shows a metal gate material layer 23 located and formed upon the semiconductor structure of FIG. 4, including in particular exposed portions of the gate dielectric 14 and the spacer 18'. The metal gate material layer 23 may comprise any of several metal gate materials. Particularly included are certain metals, metal alloys and metal nitrides, as well as laminates thereof and composites thereof. Similarly, the foregoing metal gate materials may also be formed using any of several methods. Non-limiting examples include chemical vapor deposition methods and physical vapor deposition methods, such as, but not limited to evaporative methods and sputtering methods. Typically, and for purposes of optimizing a metal gate work function within the context of a particular polarity of a field effect transistor, the metal gate material layer 23 comprises a titanium nitride material within the context of an nFET metal gate and a laminate of a tantalum nitride material and a titanium nitride material within the context of a pFET metal gate. Other metal gate materials may also be used. Typically, the metal gate material layer 23 has a thickness from about 5 to about 30 nanometers, which is intended to approximate a gate length (i.e., gate linewidth) of a metal gate subsequently formed from the metal gate material layer 23.

Figure 6:
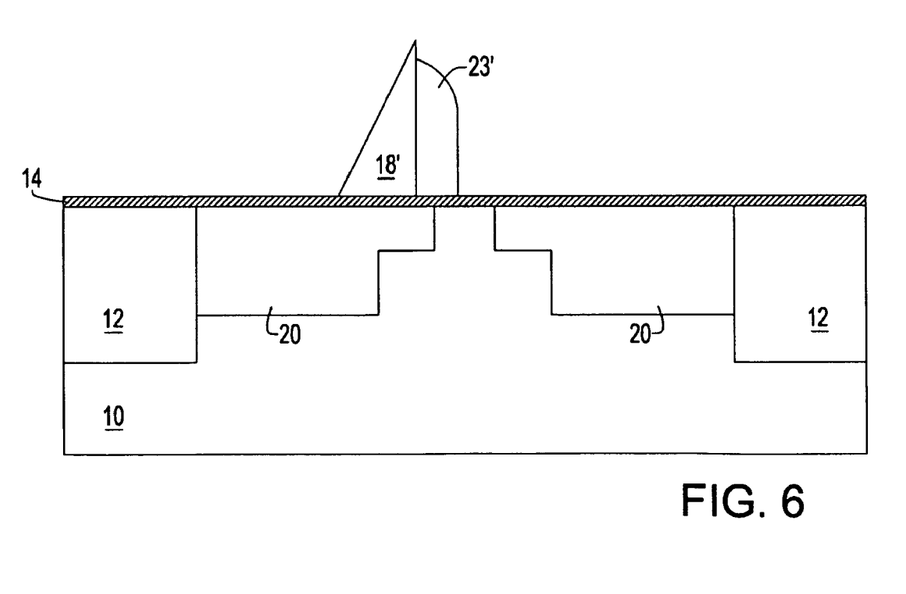

FIG. 6 shows a metal gate 23' that results from etching the metal gate material layer 23 that is illustrated in FIG. 5. As is implicitly illustrated in FIG. 6, such etching is intended as an anisotropic etching that removes all of the metal gate material layer 23 from surfaces of the semiconductor structure of FIG. 5 (i.e., including the sloped surface of the spacer 18') but for the vertical sidewall of the spacer 18'. Thus, the metal gate 23' that is illustrated in FIG. 6 will typically have a spacer shape that mirrors, to at least some extent, the spacer shape of the spacer 18'. The foregoing anisotropic etching will typically and preferably uses an etchant gas composition appropriate for the material or materials from which is comprised the metal gate material layer 23.

As is also illustrated in FIG. 6, given a particular thickness of the metal gate material layer 23, a resulting metal gate 23' over the channel that separates the source and drain regions 20 is asymmetric with a linewidth less than the channel width, and thus also asymmetric with respect to the source and drain regions 20. Although less preferred, the embodiment also contemplates that given a greater linewidth the metal gate 23', while aligned with respect to the left hand source and drain region 20 edge, may nonetheless overlap at least an extension region portion of the right hand source and drain region 20.

Figure 7:
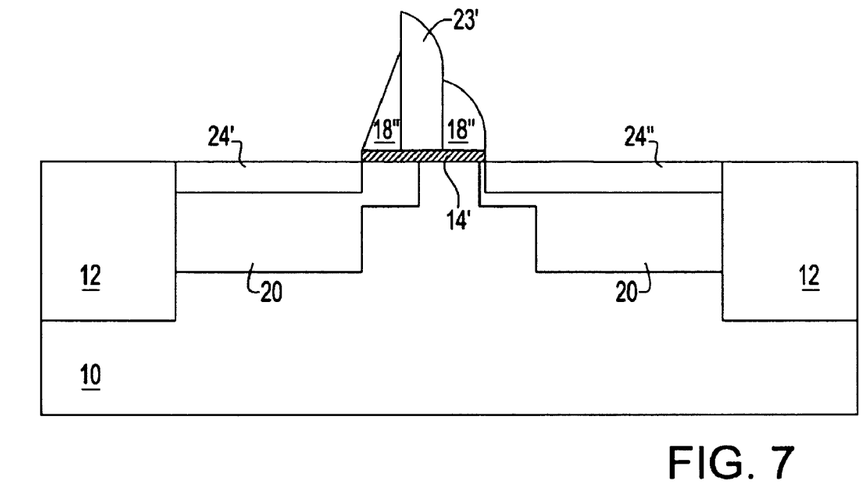

FIG. 7 first shows a spacer 18" that results from augmentation and etching of the spacer 18' that is illustrated in FIG. 6. Typically the spacer 18" comprises the same dielectric spacer material as the spacer 18' that is illustrated in FIG. 6. Typically, although not necessarily exclusively, the spacer 18" is formed incident to a blanket layer deposition of an additional spacer material upon the semiconductor structure of FIG. 6, and a subsequent etchback of that additional blanket spacer material layer and the spacer 18'. When a particularly deposited additional blanket spacer material layer is particularly thick in comparison with the spacer 18', the spacer 18" may have approximately equivalent linewidth dimensions upon each side of the metal gate 23'. Under alternative deposition and etch conditions, the spacer 18" may alternatively have differing linewidth dimensions upon each opposite side of the metal gate 23'.

FIG. 7 next shows a gate dielectric 14' that results from etching the gate dielectric 14 that is illustrated in FIG. 6, while using the metal gate 23' and the spacer 18" as an etch mask. Such etching of the gate dielectric 14 to provide the gate dielectric 14' may use a wet chemical etch method, as well as a dry plasma etch method, or alternatively a combination of a wet chemical etch method and a dry plasma etch method. Anisotropic dry plasma etch methods are most common insofar as anisotropic dry plasma etch methods provide generally straight sidewalls to anisotropically etched features.

Finally, FIG. 7 shows a plurality of silicide layers 24' and 24" located and formed upon the plurality of source and drain regions 20 that is illustrated in FIG. 6 to provide a left hand source and drain region 20' upon which is formed the silicide layer 24' and a right hand source and drain region 20" upon which is formed the silicide layer 24".

The silicide layers 24' and 24" may comprise any of several silicide forming metals. Non-limiting examples of candidate silicide forming metals include nickel, cobalt, titanium, tungsten, erbium, ytterbium, platinum and vanadium silicide forming metals. Nickel and cobalt silicide forming metals are particularly common. Others of the above enumerated silicide forming metals are less common. Typically, the silicide layers 24' and 24" are formed using a salicide method. The salicide method includes: (1) forming a blanket silicide forming metal layer upon the semiconductor structure of FIG. 6 after forming the spacer 18" and the gate dielectric 14'; (2) thermally annealing the blanket silicide forming metal layer with silicon surfaces which it contacts to selectively form the silicide layers 24' and 24" while leaving unreacted metal silicide forming metal layers on, for example, the isolation region 12, the spacer 18" and the metal gate 23'; and (3) selectively stripping unreacted portions of the silicide forming metal layers from, for example, the isolation region 12, the spacer 18 and the metal gate 23'. Typically, the silicide layers 24' and 24" comprise a nickel silicide material or a cobalt silicide material that has a thickness from about 4 to about 20 nanometers.

As is illustrated within the schematic cross-sectional diagram of FIG. 7, the source and drain regions 20' and 20", while initially derived from the symmetrically identically dimensioned and shaped source and drain regions 20, are now asymmetric since the silicide layers 24' and 24" are asymmetric with respect to the channel, the source and drain regions 20 and 20" and the metal gate 23'. The silicide layers 24' and 24", while generally although not necessarily of different size, may nonetheless be spaced the same distance from the metal gate 23' under circumstances where the spacer 18" has the same linewidth on the left hand side of the metal gate 23' as on the right hand side of the metal gate 23'.

FIG. 7 shows a schematic cross-sectional diagram of a semiconductor structure in accordance with a particular embodiment of the invention that comprises a first embodiment of the invention. The semiconductor structure includes a field effect structure that typically comprises a field effect transistor structure. The field effect structure in particular includes a metal gate 23' (which may be of less than lithographically resolvable linewidth since the metal gate 23' is formed self-aligned with respect to the spacer 18' that provides a self-alignment feature) that has a spacer shape. Within the field effect structure, the metal gate 23' is also located asymmetrically with respect to the channel that separates the source and drain regions 20' and 20". Thus, the metal gate 23' is also asymmetric with respect to the source and drain regions 20' and 20", although the metal gate 23' may be equally separated from the silicide layers 24' and 24".

The field effect transistor structure whose schematic cross-sectional diagram is illustrated in FIG. 7 may be fabricated as an nFET or a pFET, or alternatively within the context of a CMOS structure that includes both nFET devices and pFET devices. Within the context of a pFET more particularly, but also within the context of a nFET, the source and drain region 20' is preferably a source region, which due to due to a larger size closer in proximity to the metal gate 23' exhibits a decreased source resistance. Similarly when the remaining source and drain region 20" comprises a drain region, that is further spaced and separated from the metal gate 23', such a drain region has a reduced drain capacitance that may contribute to improved short channel effect properties within the field effect transistor structure whose schematic cross-sectional diagram is illustrated in FIG. 7.

Figure 8:
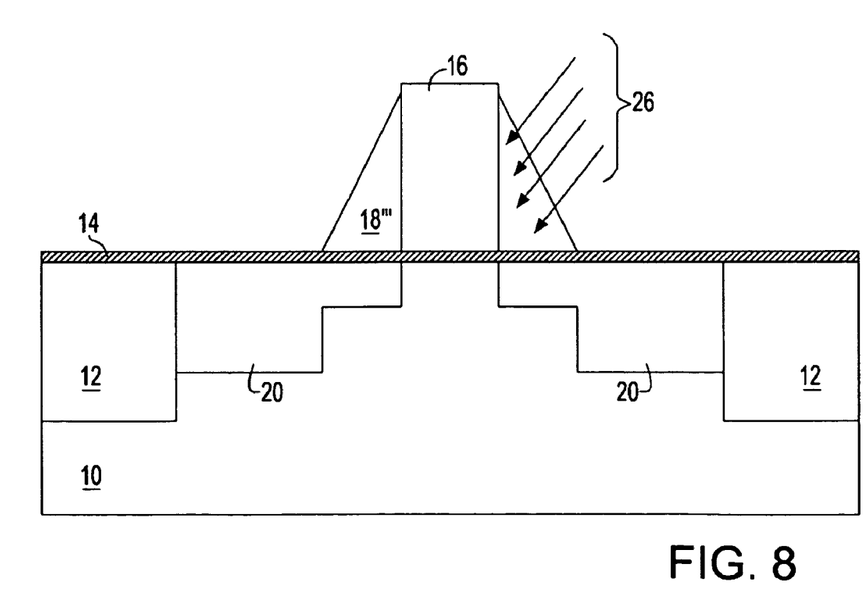
FIG. 8 shows a schematic cross-sectional diagram illustrating a semiconductor structure in accordance with a particular alternative processing step that may be used in place of FIG. 3 further in accordance with the foregoing embodiment of the invention, to provide an alternative other particular methodological embodiment of the invention.

FIG. 8 shows a schematic cross-sectional diagram of an alternative process step that may be used in place the semiconductor processing step that is illustrated within FIG. 3 within the foregoing first embodiment of the invention. FIG. 8 is thus intended to illustrate, in pertinent part, a second methodological embodiment, but not necessarily structural embodiment, of the invention. In accordance with disclosure above, FIG. 3 illustrates a block mask 22 that partially masks the spacer 18 and the dummy gate 16 so that a portion of the spacer 18 may be etched to form the spacer 18' that is illustrated in FIG. 3.

In the alternative of that particular processing step and processing sequence that is illustrated in FIG. 3, FIG. 8 illustrates a directional large angle tilt implant (LATI) ion implantation of a portion of the spacer 18 that is illustrated in FIG. 2 to form a spacer 18'". The large angle tilt implant method uses implanting ions 26 that are intended to modify the spacer material from which is comprised the spacer 18 when forming the spacer 18'", so that either the ion implanted portion of the spacer 18'" or the non-ion implanted portion of the spacer 18'" is more readily etched to form a spacer functionally, if not necessarily dimensionally, equivalent to the spacer 18' that is illustrated in FIG. 3.

Subsequent to etching a particular portion of the spacer 18'" as illustrated in FIG. 8 when forming a spacer functionally equivalent to the spacer 18' that is illustrated in FIG. 3, the resulting semiconductor structure is subjected to a processing sequence that is analogous, equivalent or identical to the processing that is illustrated within the first embodiment within the context of FIG. 4 to FIG. 7. Such processing provides a semiconductor structure that is functionally equivalent or analogous, if not necessarily dimensionally identical, to the semiconductor structure whose schematic cross-sectional diagram is illustrated in FIG. 7.

The foregoing preferred embodiments are illustrative of the invention rather than limiting of the invention. Revisions and modifications may be made to methods, materials, structures and dimensions of a semiconductor structure in accordance with the preferred embodiments while still providing a semiconductor structure, and a method for fabrication thereof, in accordance with the invention, further in accordance with the accompanying claims.

What is claimed is:

1. A semiconductor structure comprising:
   a semiconductor substrate that includes a channel region;
   a plurality of source regions and drain regions located within the semiconductor substrate and separated by the channel region;
   a metal gate that has a spacer shape located over the channel region, where the plurality of source regions and drain regions is asymmetric with respect to the metal gate; and
   a spacer located on opposite sidewalls of said metal gate, wherein the spacer on one sidewall has a different height than the spacer on the opposing sidewall.

2. The semiconductor structure of claim 1 wherein the semiconductor substrate comprises a bulk semiconductor substrate.

3. The semiconductor substrate of claim 1 wherein the semiconductor substrate comprises a semiconductor-on-insulator substrate.

4. The semiconductor structure of claim 1 wherein the semiconductor substrate comprises a hybrid orientation substrate.

5. The semiconductor structure of claim 1 wherein the plurality of source regions and drain regions is asymmetric in shape with respect to the metal gate.

6. The semiconductor structure of claim 1 wherein the plurality of source regions and drain regions is asymmetric in location with respect to the metal gate.

7. The semiconductor structure of claim 1 wherein the plurality of source regions and drain regions is asymmetric in dopant profile with respect to the metal gate.

8. The semiconductor structure of claim 1 wherein the metal gate comprises a metal material selected from the group consisting of metals, metal alloys and metal nitrides.

9. The semiconductor structure of claim 1 further comprising a plurality of silicide layers located upon the plurality of source regions and drain regions.

10. The semiconductor structure of claim 9 wherein the plurality of silicide layers is spaced equally from the metal gate.

11. The semiconductor structure of claim 1 further comprising a gate dielectric located interposed between the metal gate and the channel, the gate dielectric comprising a gate dielectric material having a dielectric constant greater than 20.

12. A semiconductor structure comprising:
    a semiconductor substrate that includes a channel region;

a plurality of source regions and drain regions located within the semiconductor substrate and separated by the channel region;

a metal gate that has a spacer shape located over the channel region;

a gate dielectric located interposed between the metal gate and the channel; and a spacer located adjacent opposite sidewalls of the metal gate and located on an upper surface of the gate dielectric, wherein the spacer on one sidewall has a different height than the spacer on the opposing sidewall and, where the plurality of source regions and drain regions is asymmetric with respect to the metal gate.

13. The semiconductor structure of claim 12 further comprising a plurality of silicide layers located upon the plurality of source regions and drain regions.

14. The semiconductor structure of claim 13 wherein the plurality of silicide layers is equally spaced from the metal gate.

15. The semiconductor structure of claim 12 wherein the gate dielectric comprises a gate dielectric material having a dielectric constant greater than 20.

16. A method for fabricating a semiconductor structure comprising:

forming a dummy gate over a semiconductor substrate;

forming a first spacer adjacent the dummy gate;

forming a plurality of source regions and drain regions into the semiconductor substrate that are separated by a channel within the semiconductor substrate while using, at least in part, the gate and the first spacer as a mask;

stripping a portion of the first spacer, and all of the dummy gate, from over the semiconductor substrate to leave a remaining portion of the first spacer over the semiconductor substrate;

forming a spacer shaped metal gate over the channel and asymmetric with respect to the plurality of source regions and drain regions while using the remaining portion of the first spacer as a self-alignment feature; and forming a second spacer on an opposing sidewall of said spacer shaped metal gate not including said first spacer, wherein said first and second spacer have different spacer heights.

17. The method of claim 16 wherein the stripping the portion of the first spacer uses a selective masking and etch method.

18. The method of claim 16 wherein the stripping the portion of the first spacer uses a selective ion implantation and etch method.

19. The method of claim 16 wherein the forming the spacer shaped metal gate uses an anisotropic etch method.

20. The method of claim 19 wherein the anisotropic etch method provides the spacer shaped metal gate of sub-lithographic linewidth.

* * * * *